(12) United States Patent
Ho

(10) Patent No.: US 10,438,649 B2
(45) Date of Patent: Oct. 8, 2019

(54) SYSTEMS AND METHODS FOR CONSERVING POWER IN SIGNAL QUALITY OPERATIONS FOR MEMORY DEVICES

(71) Applicant: Micron Technology, Inc., Boise, ID (US)

(72) Inventor: Michael V. Ho, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/924,857

(22) Filed: Mar. 19, 2018

(65) Prior Publication Data

US 2019/0259441 A1 Aug. 22, 2019

Related U.S. Application Data

(60) Provisional application No. 62/631,755, filed on Feb. 17, 2018.

(51) Int. Cl.
| | | |
|---|---|---|
| G11C 7/00 | (2006.01) | |
| G11C 7/10 | (2006.01) | |
| G11C 11/4076 | (2006.01) | |
| G11C 11/4093 | (2006.01) | |
| G11C 29/50 | (2006.01) | |
| G11C 11/4096 | (2006.01) | |
| G11C 11/4094 | (2006.01) | |

(52) U.S. Cl.
CPC ...... *G11C 11/4076* (2013.01); *G11C 11/4093* (2013.01); *G11C 11/4094* (2013.01); *G11C 11/4096* (2013.01); *G11C 29/50012* (2013.01)

(58) Field of Classification Search
CPC ............ G11C 11/4076; G11C 11/4093; G11C 11/4096; G11C 29/50012
See application file for complete search history.

(56) References Cited

U.S. PATENT DOCUMENTS

| 9,558,849 B1 | 1/2017 | Fung et al. |
|---|---|---|
| 2008/0106297 A1 | 5/2008 | Jao |
| 2009/0273981 A1 | 11/2009 | Moschiano et al. |
| 2010/0253384 A1 | 10/2010 | Sohn |

(Continued)

OTHER PUBLICATIONS

PCT International Search Report & Written Opinion for PCT Application No. PCT/US2018/055847 dated Jan. 31, 2019; 13 Pages.

*Primary Examiner* — Toan K Le
(74) *Attorney, Agent, or Firm* — Fletcher Yoder, P.C.

(57) ABSTRACT

A semiconductor device may include a plurality of memory banks and an output buffer that couples to the plurality of memory banks. The output buffer may produce a data voltage signal representative of data to be read from at least one of the plurality of memory banks. The semiconductor device may also include a driver circuit having a pulse generator and a pull-down switch that couples the output buffer to ground, such that the pull-down switch provides the data voltage signal to the output buffer. The semiconductor device may also include a test mode circuit that determines whether the data voltage signal is acceptable and sends an enable signal to the pulse generator in response to the data voltage signal not being acceptable. The enable signal causes the pulse generator to effectively operate with variations in processing, temperature, and voltage properties associated with testing.

20 Claims, 4 Drawing Sheets

(56) References Cited

U.S. PATENT DOCUMENTS

| | | |
|---|---|---|
| 2015/0092499 A1 | 4/2015 | Song |
| 2017/0103819 A1* | 4/2017 | Yoon .................. G11C 29/1201 |
| 2019/0115053 A1* | 4/2019 | Park ........................ G11C 5/04 |

* cited by examiner

SYSTEMS AND METHODS FOR CONSERVING POWER IN SIGNAL QUALITY OPERATIONS FOR MEMORY DEVICES

CROSS REFERENCE TO RELATED APPLICATIONS

This application is a Non-Provisional Application claiming priority to U.S. Provisional Patent Application No. 62/631,755, entitled "Systems and Methods for Conserving Power in Signal Quality Operations for Memory Devices," filed Feb. 17, 2018, which is herein incorporated by reference.

BACKGROUND

Field of the Present Disclosure

Embodiments of the present disclosure relate generally to the field of semiconductor devices. More specifically, embodiments of the present disclosure relate to increasing a quality of output signals received by memory devices.

Description of Related Art

A semiconductor device, such as a microcomputer, memory, gate array, among others, may receive data that is to be written into a memory cell or read from a memory cell. When data is being produced by the semiconductor device, the semiconductor device may initially drive the data (e.g., low voltage or high voltage) in an output buffer. To ensure that the data produced at the output buffer is read or written accurately by a corresponding memory component, the output buffer should produce a voltage signal that has a certain slew rate, which may be defined as a change in voltage per unit of time (e.g., V/s). The slew rate may be defined for each individual type of memory component based on certain properties associated with the operation of the memory component, such as temperature, voltage, manufacturing process, noise, and the like. As memory components become capable of producing data at higher frequencies, the slew rate of a received voltage signal may become more difficult to control, and, as a result, a data eye diagram representative of the received data becomes narrower. As the data eye diagram narrows, the integrity of the received data may be more likely to be erroneously read or erroneously written by the memory device. Embodiments described herein detail the design and architecture in which circuit components may be incorporated into a semiconductor device to control the slew rate of a provided voltage signal (e.g., data), such that the resulting data eye diagram has an increased eye width, thereby improving the signal quality of the data.

DETAILED DESCRIPTION

Figure 1:
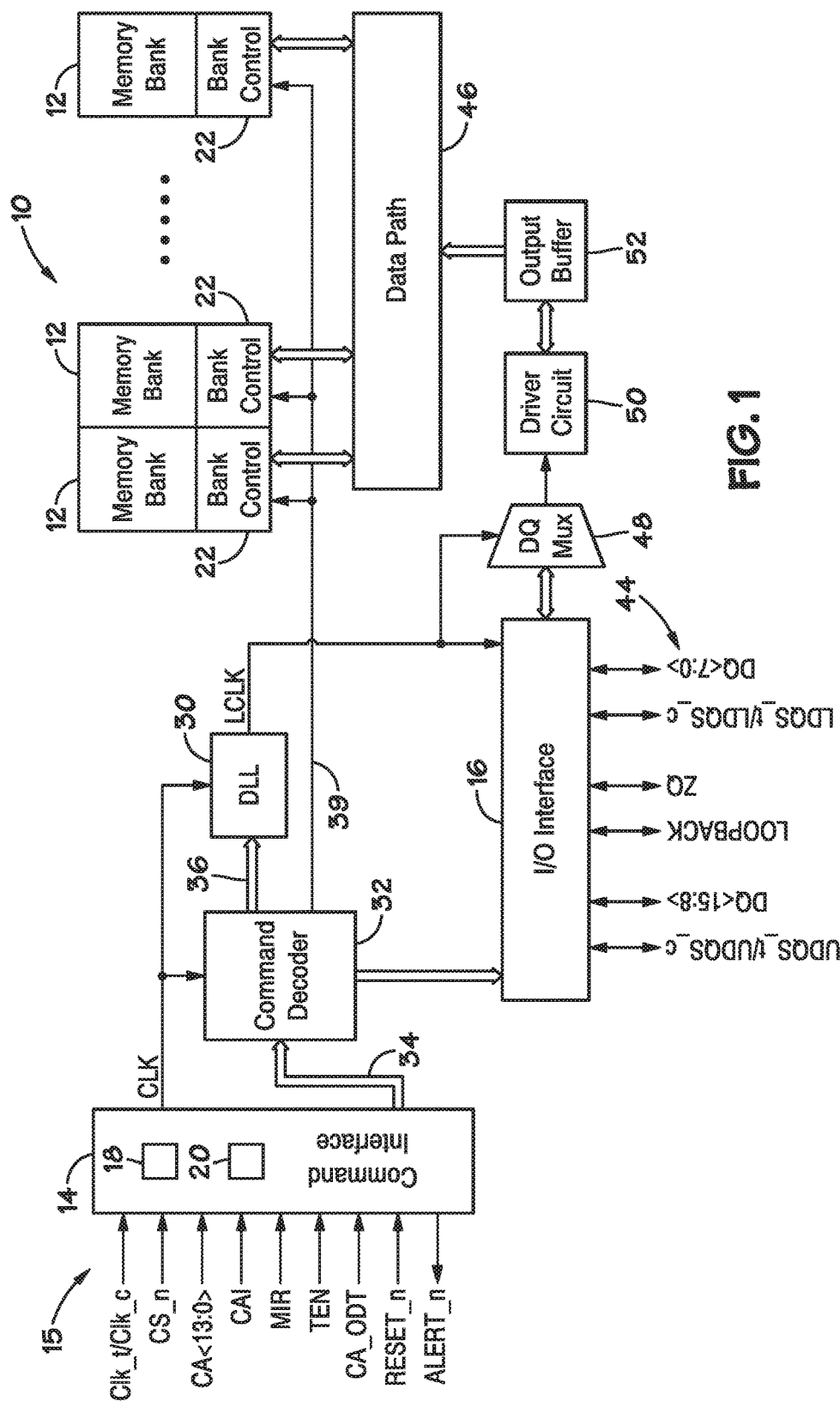
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The ability of memory devices (e.g., dynamic random-access memory (DRAM)) to accurately read and write data signals transmitted in channels between the memory device and a controller may depend on properties of a data eye diagram that corresponds to the transmitted data signals. The data eye diagram may, for example, characterize the integrity of the transmitted data voltage signals and the ability of the memory device to accurately detect the transmitted data voltage signals. Generally, the data eye diagram provides an indication of the distortion that may be present on the data voltage signals. For example, the data eye diagram may provide an indication with regard to whether data voltage signals are provided within an appropriate amount of time, synchronized with a system clock, have sufficient amplitude, include a specified range of voltage values, includes noise properties, and the like.

As memory devices increasingly operate at higher frequencies and lower voltages, data voltage signals should switch between high and low voltage values in an efficient manner. Indeed, since the data eye diagrams are both time-dependent and voltage-dependent, high-frequency devices, such as double data rate fourth-generation synchronous dynamic random-access memory (DDR4) and double data rate fifth-generation synchronous dynamic random-access memory (DDR5) that have fast clock times and low voltage operations, may often result in data eye diagrams that have smaller widths. To widen the data eye diagram of the transmitted data voltage signals, the present embodiments of this disclosure include circuitry that enable data voltage signals to transition between high and low states within a half cycle to ensure that an accurate value of the data voltage signal is sampled and received by the memory device. By ensuring that the data voltage signals transition within an appropriate amount of time, the resulting data eye diagrams may widen, thereby enabling the memory device to accurately detect the data voltage signals.

With the foregoing in mind, memory devices may include an output buffer in which data voltage signals that may be read from or written into memory bank of the memory device. Generally, the data voltage signals may provide a high voltage value (e.g., VDDQ) via an output terminal with some external resistance (e.g., 50 ohms). Each memory device may have some output external resistance based on the type of memory device, the manufacturer, the design of the memory device, and the like. By having this external resistance coupled to the high voltage source, the output buffer may have the assistance of the external resistance in increasing the voltage signal provided to the output buffer to a high value (e.g., VOH). By contrast, when transitioning from a high voltage value to a low voltage value (e.g., VOL), the memory device may couple the output buffer to ground via a pull-down switch without a line resistance that counteracts the external resistance of the output buffer when it is coupled to the high voltage source. As such, it may be a challenge for the memory device to transition the data voltage signal provided to the output buffer from a high voltage value to a low voltage value in a manner that allows the memory device to accurately read or write the corresponding data voltage signal.

In some embodiments, to ensure that the transition of the data voltage signal from high to low is provided to the output buffer during an appropriate time window (e.g., within a first half cycle), a pull-down driver may couple the output buffer to ground using two switches during the transition. By using two separate connections to ground, the pull-down driver may control a slew rate (e.g., a change of voltage per unit of time (V/s)) of the data voltage signal, such that the data voltage signal achieves the low voltage value within a half cycle. In addition, one of the two switches may be coupled to a resistor to counteract the pull-up driving employed by the memory device via the external resistor when the data voltage signal transitions from low to high.

Keeping this in mind, in some embodiments, the pull-down driver may include a first switch (e.g., main switch) that couples the output buffer to ground for the full duration of the cycle that corresponds to the low data voltage signal. The pull-down driver may also include a second switch (e.g., pre-emphasis switch) that may couple the output buffer to ground for a shorter duration, as compared to the first switch. The two switches may be synchronized to couple the output buffer to ground via both switches until the second switch opens, thereby coupling the output buffer to ground via one switch for the remaining portion of the cycle. As a result, the data voltage signal applied to the output buffer may have a wider data eye diagram, which corresponds to an improvement in the quality of the data voltage signal received at the output buffer. In some embodiments, the timing in which the second switch keeps the output buffer coupled to ground may be based on the external resistance present on the memory device, a limit with regard to the value of the data voltage signal on the output buffer, minimum or maximum limits on the voltage slew rates under certain conditions (e.g. output loadings, data patterns, and noise profiles), and the like.

Although using the second switch may assist the data voltage signal in achieving a higher quality signal, the continuous operation of the pull-down driver (e.g., pulse generator of the pull-down driver) for voltage transition may result in a certain amount of power consumption. In some cases, for example at relatively lower clock cycles (e.g., less than 2400 MHz), the data voltage signal may have a sufficient amount of time to reach its desired output without employing the pull-down driver. As such, in some embodiments, a test mode circuit may conduct various tests to determine if the memory device accurately outputs a data voltage signal at a certain clock frequency. If the test mode circuit determines that the data voltage signal is adequate or acceptable, the memory device may be configured to forgo using the pull-down driver and the second switch. As a result, the memory device may consume power more efficiently. Additional details with regard to the operations of the pull down driver and the operation thereof will be discussed below with reference to FIGS. 1-5.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random-access memory (DDR5 SDRAM) device. Various features of DDR5 SDRAM allow for reduced power consumption, more bandwidth, increased speed (e.g., clocking frequency), and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 may provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 39. As will be appreciated, the memory device 10 may include various other decoders, such as row decoders and column decoders, to facilitate access to the memory banks 12. In one embodiment, each memory bank 12 includes a bank control block 22, which provides the necessary decoding (e.g., row decoder and column decoder), as well as other features, such as timing control and data control, to facilitate the execution of commands to and from the memory banks 12.

In certain embodiments, the memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal, which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10 based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data or output data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

In certain embodiments, the memory device 10 may receive data to be written into the memory bank 12 via a DQ multiplexer (MUX) 48. The data multiplexed via the DQ MUX 48 may be provided to driver circuit 50, which may be coupled to the IO interface 16. The driver circuit 50 may include circuit components that control a slew rate of a data voltage signal provided to an output buffer 52. The data voltage signal represents the data provided to the IO interface 16. Generally, the driver circuit 50 may receive a digital data value (e.g., I/O) via the DQ MUX 48 and generate a corresponding data voltage signal to provide to the output buffer 52. The output buffer 52 may be coupled to the data path 46, which may provide the data voltage signal to a respective memory bank 12 for a write or read operation. Additional details with regard to the components and operation of the driver circuit 50 will be described below with reference to FIGS. 2-4.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
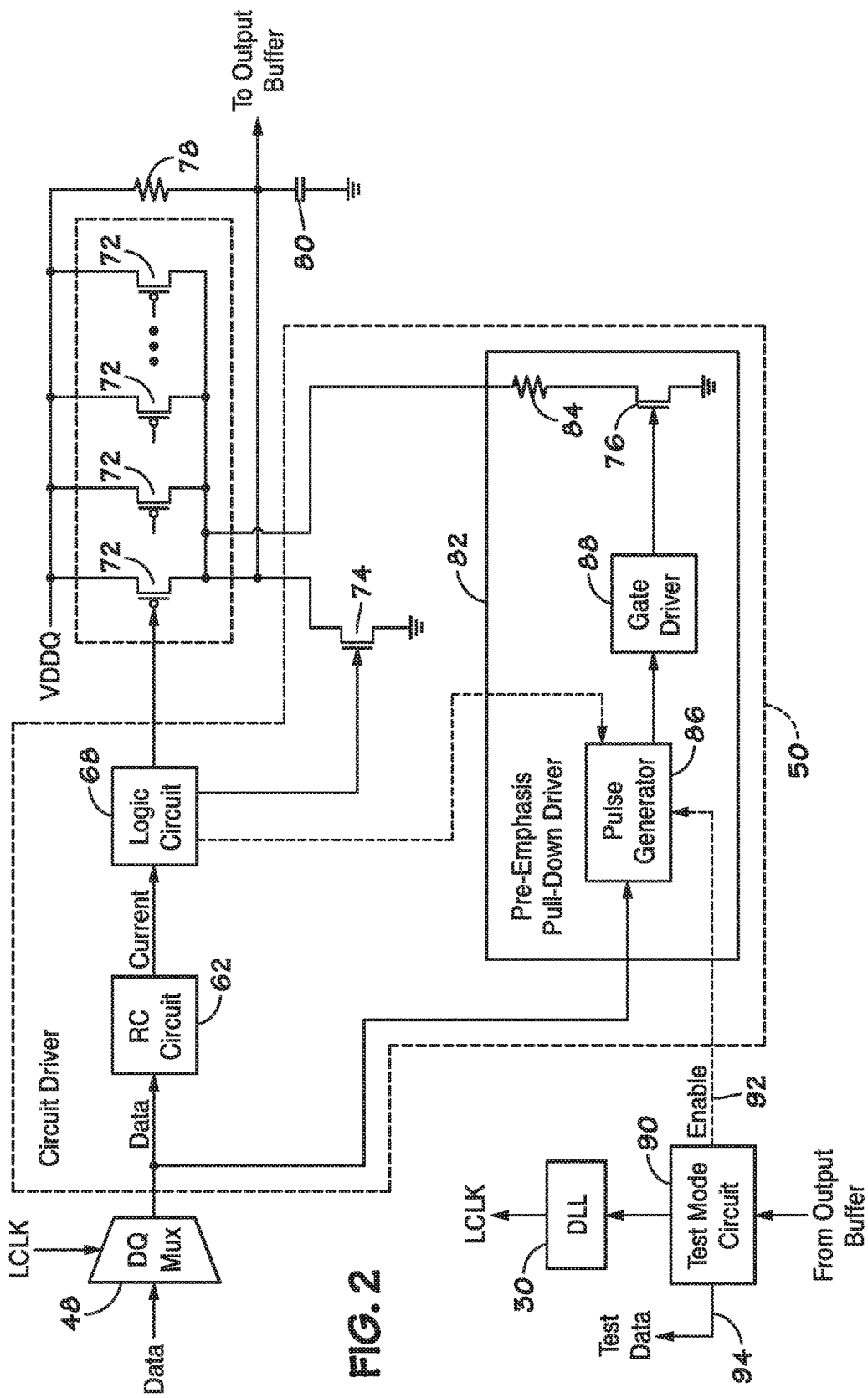
FIG. 2 is a simplified block diagram illustrating a driver circuit within the memory device of FIG. 1, according to an embodiment of the present disclosure.

Keeping the foregoing in mind, FIG. 2 illustrates a block diagram of the driver circuit 50 and the components therein. As mentioned above, the driver circuit 50 may receive data via the DQ MUX 48, which may multiplex data to the driver circuit 50 based on the phase controlled internal clock signal LCLK. The incoming data may be provided to a resistor-capacitor (RC) circuit 62, which may be any suitable RC electrical circuit that may be driven by a voltage or current source. The RC circuit 62 may be designed based on the specifications of the memory device 10 to enable the driver circuit 50 to provide timing signals to switches 72, switches 74, and switches 76 to control the slew rate of the data voltage signal provided to the output buffer 52.

The switches 72, switches 74, and switches 76 may be any suitable switch circuit (e.g., MOSFET) that may open or close based on a provided gate signal. As shown in FIG. 2, the switches 72 may couple a voltage source (e.g., VDDQ) to the output buffer 52. Each switch 72 may represent a leg or phase in which the voltage source VDDQ may be coupled to the output buffer. In some embodiments, each leg may include a resistor (not shown) such that the line impedance of the connected switches 72 (e.g., internal switch on-resistance) and legs may be equal to some value, which may be specified by the memory device 10. For example, if the memory device 10 expects a 34-ohm line resistance to be present on the data path 46, seven switches 72 may be coupled together in parallel, such that each leg may include a 270-ohm resistor to provide a 34-ohm equivalent resistance when all seven of the switches 72 are closed. Although the switches 74 and 76 are illustrated at P-type switches and the switch 72 is illustrated as an N-type switch, it should be noted that the switches 72, 74, and 76 may be any suitable type of switch.

To control the slew rate of the voltage provided to the data path 46 via the voltage source VDDQ, the logic circuit 68 may control the manner in which the switches 72 are closed. That is, if each of the switches 72 is closed at the same time, the voltage provided to the data path (e.g., via capacitor 80) may quickly rise to the voltage value of the voltage source VDDQ. In some cases, the voltage provided to the data path 46 may overshoot the voltage value of the voltage source VDDQ. To avoid overshooting the voltage value and to control the slew rate of the voltage signal provided on the data path 46, the logic circuit 68 may output gate signals to different sets of switches 72 or legs at certain intervals of time.

Generally, the logic circuit 68 may receive a current signal via the RC circuit 62 and determine a strength of the current signal based on the current value. Based on the strength of the current signal, the logic circuit 68 may send a gate signal to a set of switches 72, thereby providing additional connections to the voltage source VDDQ. It should be noted that when the driver circuit 50 is not receiving data, the output buffer 52 may still be coupled to the voltage source VDDQ via external resistor 78. The resistance value of the external resistor 78 may be determined based on some impedance value specified by the manufacturer of the memory device 10 or the like. In some cases, the resistance value of the external resistor 78 is chosen to match a pre-determined impedance value for the output buffer 52. The matching of impedance values between the voltage source VDDQ and the output buffer 52 may assist the memory device 10 in operating more efficiently.

In any case, when a logic one is being provided to the output buffer 52, the logic circuit 68 may close one or more switches 72 to couple the output buffer 52 to the voltage source VDDQ, thereby providing multiple paths to connect a capacitor 80 to the voltage source VDDQ. As a result, the voltage signal present on the output buffer 52 may reach a high voltage VOH, which may correspond to VDDQ. In contrast, when a logic zero is being provided to the output buffer 52, the logic circuit 68 may close switch 74 and open switches 72 to couple the output buffer 52 to ground. However, when transitioning from logic one to logic zero, the voltage signal applied to the output buffer 52 may include some delay before reaching a low voltage VOL (e.g., VOL=0.4*VDDQQ) due to the external resistor 78 present on the pull-up portion of the driver circuit 50. In high frequency memory devices, this delay may narrow the data eye diagram and cause the memory device 10 to use an incorrect voltage value to write or read the corresponding data. That is, with memory devices 10 that operate at high frequencies, the voltage signal may have less time to transition from the high voltage value VOH to the low voltage value VOL.

With the foregoing in mind, in certain embodiments, a pre-emphasis pull-down driver circuit 82 may provide an additional path to connect the output buffer 52 to ground, in addition to via the switch 74. The pre-emphasis pull-down driver 82 may control the operation of the switch 76, which may be coupled to resistor 84, to assist the driver circuit 50 in pulling down the voltage signal applied to the output buffer 52. By providing multiple paths to ground and by including the resistor 84, the pre-emphasis pull-down driver circuit 82 may increase the slew rate of the data voltage signal applied to the output buffer 52, thereby ensuring that the data voltage signal applied to the output buffer 52 reaches the low voltage value VOL within a certain amount of time (e.g., half cycle).

To ensure that the data voltage signal efficiently transitions from the high voltage value VOH to the low voltage value VOL, the pre-emphasis pull-down driver 82 may include a pulse generator 86 and a gate driver 88 to control the operation of the switch 76. In some embodiments, the pulse generator 86 may generate a pulse to cause the gate driver 88 to send a gate signal to the switch 76 at a particular time and for a specified duration. The pulse generator 86 may generate the pulse based on an indication that the incoming data via the DQ MUX 48 is a logical zero. That is, in one embodiment, the logic circuit 68 may send a start signal to the pulse generator 86 when it detects that a logical zero is to be provided to the output buffer 52. The start signal may be provided to the pulse generator 86 with respect to a delay that may ensure that the switch 76 closes synchronously with the switch 74.

As mentioned above, the logic circuit 68 may send the start signal to set a delay in which the switch 76 closes, such that the switch 76 closes synchronously with the switch 74. In addition to including this delay, the start signal may also specify a pulse width for the pulse that may be generated by the pulse generator 86. The pulse width may be determined based on an impedance value specified for the memory device 10 (e.g., impedance specified for output buffer 52), an upper voltage limit (e.g. $VOH_{limit}$) and a lower voltage limit (e.g. $VOL_{limit}$) specified for the memory device 10, and the like.

Keeping this in mind, when the two switches 74 and 76 initially close, the resulting impedance present on the output buffer 52 effectively changes due to the opening of the switches 72, the connections to ground, and the resistor 84. As mentioned above, the switch 76 may be closed for a portion of the time that the switch 74 may be closed. When determining the amount of time for the pulse width generated by the pulse generator 86, the logic circuit 68 may determine an expected impedance on the output buffer 52 during the time in which the switches 74 and 76 are both closed. The logic circuit 68 may specify that the pulse width is less than an amount of time that may cause the impedance of the output buffer 52 to be greater than some range (e.g., percentage) of a specified impedance value.

In addition, when determining the amount of time for the pulse width generated by the pulse generator 86, the logic circuit 68 may also determine whether the data voltage signal applied to the output buffer 52 will be greater than the upper voltage limit (e.g. $VOH_{limit}$) or less than the lower voltage limit (e.g. $VOL_{limit}$) specified for the memory device 10. Further, the logic circuit 68 may consider the desired slew rate for the memory device 10 when determining the pulse width. In some embodiments, the logic circuit 68, another suitable processor-based circuit, simulation software, or the like may test different pulse widths to determine whether each of the above-specified conditions are met.

When determining the pulse width that the pulse generator 86 provides to the gate driver 88, the logic circuit 68 or other suitable component may ensure that the data voltage signal provided to the output buffer 52 does not fall below the lower voltage limit (e.g. $VOL_{limit}$) specified for the memory device 10 when transitioning from high to low, maintains a desired slew rate during either transition, and achieve a desired voltage (e.g., VOL) within a half cycle. By way of example, FIG. 3 illustrates a timing diagram 100 that illustrates the operation of the driver circuit 50 and the pre-emphasis pull-down driver circuit 82 to control the data voltage signal applied to the output buffer 52, in accordance with the embodiments described herein.

Figure 3:
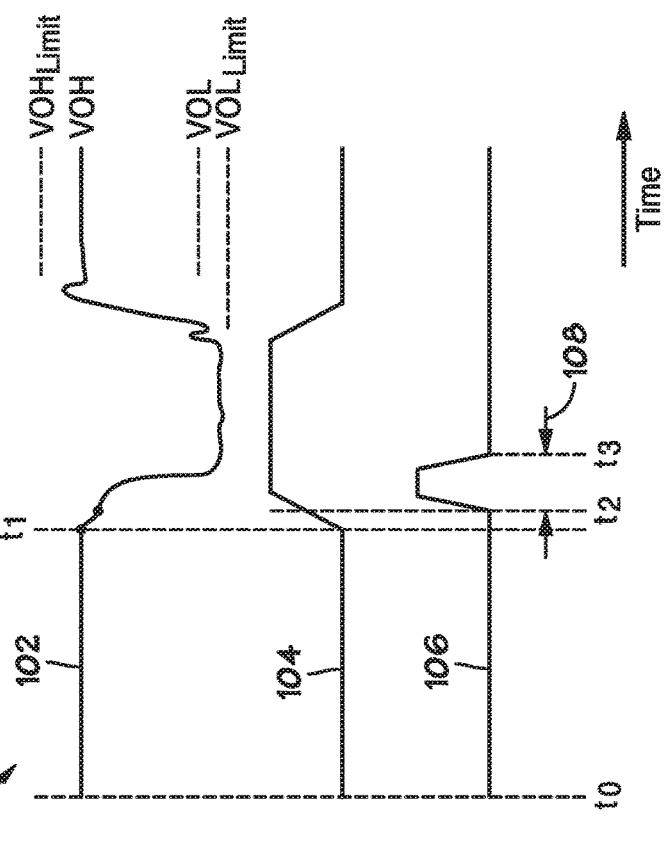
FIG. 3 illustrates an example data voltage signal having a slew rate that is controlled by a pre-emphasis pull-down driver circuit in the driver circuit of FIG. 2, according to an embodiment of the present disclosure.

Referring to FIG. 3, the timing diagram 100 may include a data voltage signal waveform 102, a pull-down gate signal 104, and a pre-emphasis pull-down gate signal 106. The data voltage waveform 102 may correspond to the voltage provided to the output buffer 52, the pull-down gate signal 104 may correspond to the gate signal provided to the gate of the switch 74, and the pre-emphasis pull-down gate signal 106 may correspond to the gate signal provided to the gate of the switch 76.

With the foregoing in mind, at time t0, the output buffer 52 may produce a high voltage value VOH. In some embodiments, the output buffer 52 may produce the high voltage value VOH when the corresponding data voltage signal represents a logic one value or when the memory device 10 is a not receiving data. That is, the output buffer 52 may produce the high voltage value VOH when the memory device 10 is not actively reading or writing data (e.g., suspended/standby state). As such, when the output buffer 52 is transitioning from a suspended or standby state to read or write data representing a logic one, the output buffer 52 may already have the high voltage value VOH without concern for exceeding the upper voltage limit (e.g. $VOH_{limit}$) or achieving the high voltage value VOH within a half cycle. Instead, the phase controlled internal clock signal LCLK may indicate that the data voltage signal on the output buffer 52 should be sampled at the appropriate time to read or write the corresponding data from or to the memory bank 12.

At time t1, the data voltage waveform 102 may transition from the high voltage value VOH to the low voltage value VOL. As such, the logic circuit 68 may send a gate signal to the gate of the switch 74, thereby causing the switch 74 to close and the output buffer 52 to be coupled to ground. As mentioned above, in addition to closing the switch 74, the logic circuit 68 may send gate signals to the gates of the switches 72 to cause the switches 72 to open.

To more efficiently transition the data voltage waveform 102 from the high voltage value VOH to the low voltage value VOL, at time t2, the logic circuit 68 may send a second gate signal to the gate of the switch 76 to provide an additional connection between ground and the output buffer 52. As such, the effective slew rate of the data voltage waveform 102 may change to cause the data voltage waveform 102 to transition to the low voltage value VOL more quickly. In some embodiments, the delay between time t1 and t2 may be tested and determined based on the same factors used to determine the pulse width. As shown in FIG. 3, the pulse width 108 may correspond to an amount of time between time t2 when the switch 76 closes to a time t3 when the switch 76 opens.

By providing an additional path between the output buffer 52 and ground, the pre-emphasis pull-down driver 82 may assist the memory device 10 to accurately read and write data produced at the output buffer 52. That is, as the frequency in which the memory device 10 operates increases, the additional path between the output buffer 52 and ground may assist the data voltage waveform 102 to reach the low voltage value VOL within a sufficient amount of time (e.g., half cycle) to ensure that accurate data is sampled from the output buffer 52.

When transitioning back to the high voltage value VOH from the low voltage value VOL, the logic circuit 68 may remove the gate signal provided to the switch 74 and provide the appropriate gate signal to the switches 72 to couple the output buffer 52 to the voltage source VDDQ.

Although the foregoing discussion of the pre-emphasis pull-down driver 82 is described as including one additional switch 76 that couples the output buffer 52 to ground, in some embodiments, multiple switches 76 may be included in the pre-emphasis pull-down driver 82 to provide additional paths to ground. In this case, the logic circuit 68 may coordinate the operation of one or more pulse generators 86 and one or more gate drivers 88 to synchronize the operations of each of the additional switches with the operation of the switch 74 in light of the lower voltage limit (e.g. $VOL_{limit}$) specified for the memory device 10 when transitioning from high to low, the upper voltage limit (e.g. $VOH_{limit}$) specified for the memory device 10 when transitioning from low to high, the desired slew rate during either transition, and the like.

Figure 4:
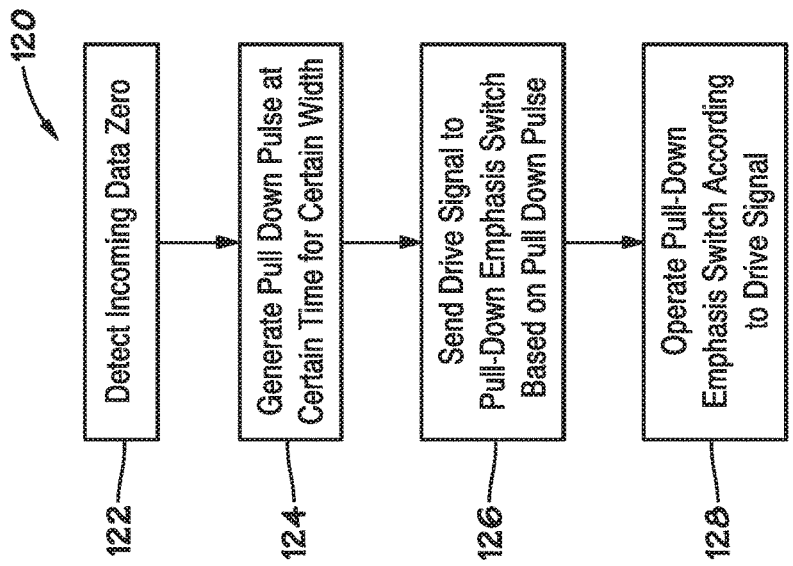
FIG. 4 illustrates a flow chart of a method for increasing a slew rate of a data voltage signal transitioning from high to low in the memory device of FIG. 1 using a pre-emphasis pull-down driver circuit, according to an embodiment of the present disclosure.

With the foregoing in mind, FIG. 4 illustrates a method 120 that the driver circuit 50 may perform to efficiently transition the data voltage signal provided to the output buffer from the high voltage value VOH from the low voltage value VOL, in accordance with the embodiments described herein. Although the following description of the method 120 is described as being performed by certain components described above with reference to FIG. 2, it should be noted that any suitable component may perform any suitable portion of the method 120.

Referring now to FIG. 4, at block 122, the pulse generator 86 may detect an incoming logical zero being provided via the DQ MUX 48. After detecting the incoming zero, the pulse generator 86 may generate a pulse signal for the gate driver 88 to cause the switch 76 to close synchronously with the switch 74. In one embodiment, the logic circuit 68 may send information related to a number of clock cycles or a particular time in which the logic circuit 68 may send a corresponding gate signal to the gate of the switch 74.

At block 124, the pulse generator 86 may generate the pulse signal that may be transmitted to the gate driver 88 at some time, such that the switch 74 and the switch 76 may simultaneously close. In one embodiment, the pulse generator 86 may generate the pulse signal with a certain width to ensure that the data voltage signal provided to the output buffer 52 reaches the low voltage value VOL within a half cycle, in accordance with the processes discussed above.

After receiving the pulse signal, the gate driver 88, at block 126, may send a drive signal to the switch 76 at a certain time and for a certain duration of time based on the received pulse signal. As a result, the switch 76, at block 128, may close and operate as a pre-emphasis pull-down switch to assist the switch 74 in transitioning the data voltage signal provided to the output buffer 52 to the low voltage value VOL. The drive signal may be provided for the duration of the pulse signal and after the drive signal is removed from the gate of the switch 76, the output buffer 52 may no longer be coupled to ground.

Although using the switch 76 may assist the data voltage signal provided to the output buffer 52 to reach the low voltage value VOL within a half cycle, the continuous operation of the pulse generator 86 for each high to low transition may result in a certain amount of power consumption. In some cases, for example at relatively lower clock cycles (e.g., less than 2400 MHz), the data voltage signal may have a sufficient amount of time to reach its desired output. As such, it may be useful to determine whether the driver circuit 50 should employ the pre-emphasis pull-down driver 82 and the corresponding switch 76 in certain memory devices 10. That is, if the memory device 10 operates at a certain clock frequency, the memory device 10 may forgo employing the pre-emphasis pull-down driver 82 to use the switch 76. As a result, the memory device 10 may consume power more efficiently.

With this in mind, and referring back to FIG. 2, in some embodiments, a test mode circuit 90 may determine whether the pre-emphasis pull-down driver 82 should be employed by the memory device 10 or not. The test mode circuit 90 may be any suitable circuit that may perform certain actions (e.g., outputs) based on received inputs. For example, the test mode circuit 90 may be communicatively coupled to the pulse generator 86 and may control the operations of the pulse generator 86. In one embodiment, the test mode circuit 90 may provide an enable signal 92 to the pulse generator 86 that causes the pulse generator 86 to operate. In this case, if the enable signal 92 is not provided to the pulse generator 86, the pre-emphasis pull-down driver 82 may not use the switch 76 to provide an additional path to ground for the output buffer 52.

By way of operation, the test mode circuit 90 may sweep through a number of clock frequencies for the internal clock 30 while monitoring the data voltage signal provided to the output buffer 52. As such, the test mode circuit 90 may send commands to the internal clock 30 to set its clock speed (e.g., frequency). Alternatively, the test mode circuit 90 may send these commands through intervening circuit components, such as the command interface 14 or the like.

In addition to the commands to the internal clock 30, the test mode circuit 90 may also send test data 94 to the DQ MUX 48. As such, the test data 94 may be represented via the data voltage signal on the output buffer 52 based on the phase-controlled internal clock signal LCLK provided by the internal clock 30 and the operation of the driver circuit 50, as described above. In certain embodiments, the test mode circuit 90 may adjust the commands provided to the internal clock circuit 30, such that the internal clock circuit 30 increases its frequency. At each frequency step of the internal clock circuit 30, the test mode circuit 90 may receive the data voltage signal via the output buffer 52 and determine whether the data voltage signal is acceptable. For instance, the test data may include at least one transition from the high voltage value VOH to the low voltage value VOL, and the transition between the two voltages may be represented in the data voltage signal present on the output buffer 52. When determining whether the data voltage signal is acceptable, the test mode circuit 90 may evaluate the data eye diagram of the data voltage signal and determine whether the data voltage signal transitions to the desired voltage value within a certain amount of time (e.g., half cycle), and the like.

If the test mode circuit 90 determines that the data voltage signal is acceptable, the test mode circuit 90 may increase the frequency of the internal clock 30 and repeat the test described above. The test mode circuit 90 may continue this test operation until it determines that the data voltage signal is not acceptable or the clock frequency has reached a desired level. If the data voltage signal is not acceptable, the test mode circuit 90 may send the enable signal 92 to the pulse generator 86, thereby causing the pulse generator 86 to operate the switch 76. In this way, the switch 76 may be operated to provide an additional path to ground and enable the data voltage signal to achieve its desired voltage value within a sufficient amount of time. Alternatively, if the clock frequency reaches the desired level, the test mode circuit 90 may cease its testing operations and allow the memory device 10 to operate without the assistance of the pre-emphasis pull-down driver 82. As such, the memory device 10 may conserve power by avoiding the operation of the pulse generator 86 while the data voltage signal maintains acceptable properties. In some embodiments, the test mode circuit 92 may perform the test operations at different times to verify that the data voltage signal is still acceptable as the memory device 10 ages.

Figure 5:
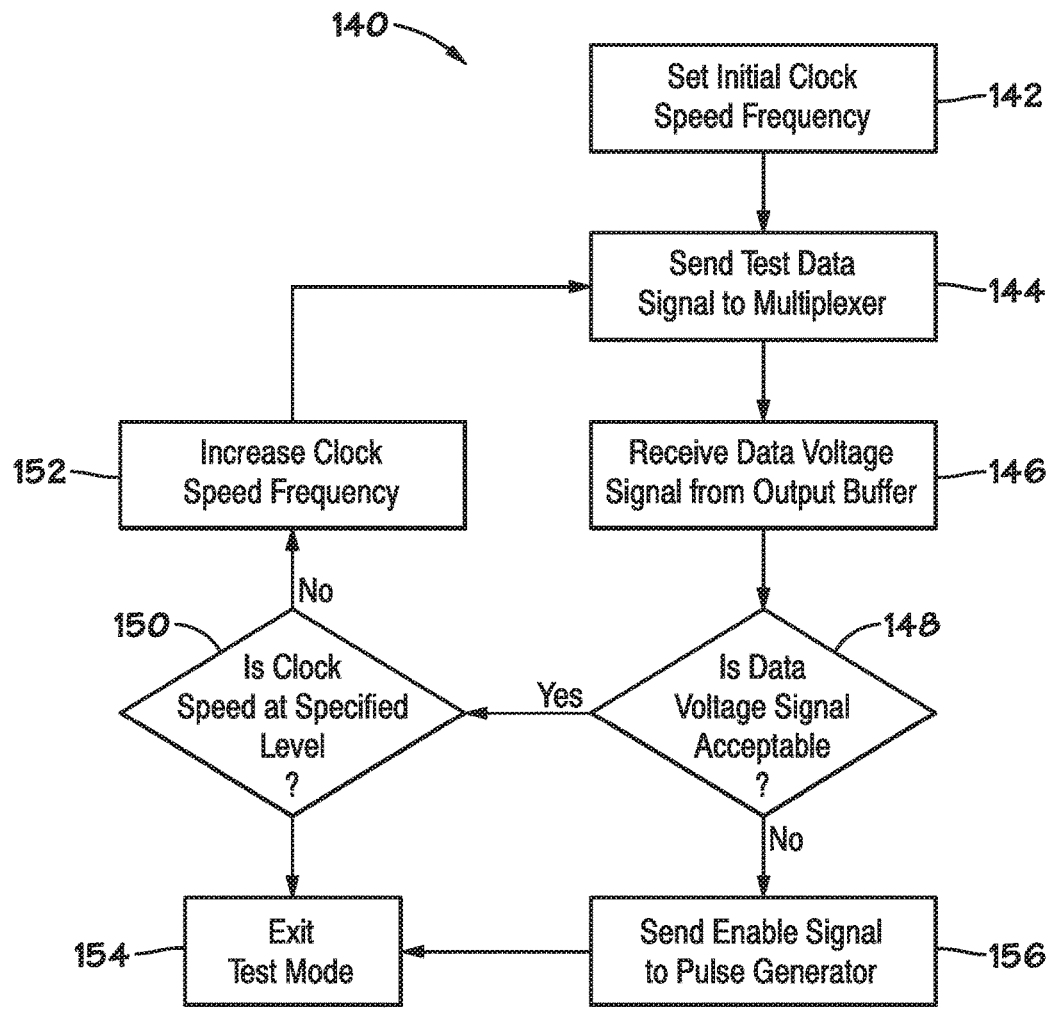
FIG. 5 illustrates a flow chart of a method for enabling a pulse generator of the pre-emphasis pull-down driver circuit in the driver circuit of FIG. 2 during a test mode operation, according to an embodiment of the present disclosure.

FIG. 5 illustrates a method 140 for enabling the pulse generator 86 of the pre-emphasis pull-down driver 82 based on the data voltage signal provided to the output buffer 52 during a test mode operation. In certain embodiments, the method 140 may be performed at various times during the operation of the memory device 10 to ensure that the memory device 10 is operating effectively.

Although the method is described as being performed in a particular order, it should be understood that the method 140 may be performed in any suitable order. Moreover, although the method 140 is described as being performed by the test mode circuit 90, it should be noted that the method 140 may be performed by any suitable logic-implementing device (e.g., processor-based, application-specific integrated circuit (ASIC)).

Referring now to FIG. 5, at block 142, the test mode circuit 90 may send a command to the internal clock 30 to set an initial clock frequency speed. After receiving the command, the internal clock 30 may generate the phase controlled internal clock signal LCLK based on the specified initial clock frequency. Generally, the initial clock frequency speed (e.g., less than 2400 MHz) is lower than the other clock frequency speeds provided to the internal clock 30 during the operation of the method 140. Using the initial clock frequency speed, the internal clock 30 may generate the phase controlled internal clock signal LCLK and send the phase controlled internal clock signal LCLK to other components of the memory device 10, as discussed above.

At block 144, the test mode circuit 90 may send a test data signal to the DQ MUX 48. The test data signal may be a square wave signal or some other signal that includes multiple transitions from the high voltage value VOH to the low voltage value VOL and vice-versa. As a result, the driver circuit 50 may output the data voltage signal that represents the test data signal onto the output buffer 52 based on the phase controlled internal clock signal LCLK output by the internal clock 30.

At block 146, the test mode circuit 90 may receive the data voltage signal from the output buffer 52, and, at block 148, determine whether the data voltage signal is acceptable. The test mode circuit 90 may use a variety of ways to determine whether the data voltage signal is acceptable. For example, the test mode circuit 90 may determine whether the data eye diagram of the data voltage signal includes an opening greater than some threshold. Alternatively, the test mode circuit 90 may determine whether the data voltage signal has a slew rate that is within a specified range of values, whether the data voltage signal reaches its desired value within a certain amount of time (e.g., half cycle), and the like.

Regardless of the scheme used to determine whether the data voltage signal is acceptable, the test mode circuit 90 may proceed to block 150 if it is determined that the data voltage signal is acceptable. At block 150, the test mode circuit 150 may determine whether the clock frequency speed provided to the internal clock 30 is at a specified level. That is, a clock speed or expected clock frequency for the memory device 10 may be specified to the test mode circuit 90 via user input or the like. If the current clock frequency speed is not at the specified speed, the test mode circuit 90 may proceed to block 152 and increase the clock frequency speed of the internal clock 30. As such, the test mode circuit 90 may send a command to the internal clock 30 to increase its clock frequency speed by a certain amount. The test mode circuit 90 may then repeat blocks 144-152 until the clock speed reaches the specified level or the data voltage signal is no longer acceptable.

If the clock speed reaches the specified level before the data voltage signal becomes unacceptable, the test mode circuit 90 may proceed to block 154 and exit the test mode. As such, the memory device 10 may operate without employing the pre-emphasis pull-down driver 82, thereby preserving the power that may have been consumed by the pulse generator 86. However, if the data voltage signal becomes unacceptable at block 148 before the clock speed reaches the specified level, the test mode circuit 90 may proceed to block 156 and send an enable signal to the pulse generator 86. As a result, the pulse generator 86 may begin to operate as described above and control the operation of the switch 76. In this way, the transition from the high voltage value VOH to the low voltage value VOL may occur more efficiently, thereby opening the width of the corresponding data eye diagram and improving the efficiency in which the data voltage signal achieves its desired voltage.

After the enable signal is transmitted to the pulse generator 86, the test mode circuit 90 may proceed to block 154 and exit the test mode. The pre-emphasis pull-down driver 82 may then continue to operate until the enable signal is no longer provided to the pulse generator 86. In one embodiment, the test mode circuit 90 may blow a fuse or other circuit component to cause the enable signal to be continuously provided to the pulse generator after block 156. In other embodiments, the test mode circuit 90 may perform the method 140 at various intervals to verify whether the pre-emphasis pull-down driver 82 should be used by the memory device or not.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
a plurality of memory banks;
an output buffer configured to couple to the plurality of memory banks, wherein the output buffer is configured to produce a data voltage signal representative of data to be read from at least one of the plurality of memory banks;
a driver circuit comprising a pulse generator and a pull-down switch configured to couple the output buffer to ground, wherein the pull-down switch is configured to provide the data voltage signal to the output buffer; and a test mode circuit configured to:
  determine whether the data voltage signal is acceptable or not acceptable, wherein the test mode circuit is configured to determine whether the data voltage signal is acceptable based on a data eye diagram associated with the data voltage signal; and
  send an enable signal to the pulse generator if the data voltage signal is not acceptable, wherein the enable signal is configured to cause the pulse generator to operate.

2. The semiconductor device of claim 1, wherein the test mode circuit is configured to determine whether the data voltage signal is acceptable based on whether the data voltage signal reaches a low voltage value within an amount of time.

3. The semiconductor device of claim 2, wherein the amount of time corresponds to a half cycle of an internal clock of the semiconductor device.

4. The semiconductor device of claim 1, wherein the pulse generator is configured to generate a pulse signal configured to cause the pull-down switch to close for a period of time.

5. The semiconductor device of claim 1, wherein the test mode circuit is configured to:
  determine whether an internal clock of the semiconductor device is operating at a specified value in response to determining that the data voltage signal is acceptable; and
  operate the semiconductor device without using the pulse generator in response to the internal clock operating at the specified value.

6. The semiconductor device of claim 1, wherein the pulse generator is configured to receive the data via a multiplexer.

7. A driver circuit, configured to:
  receive a first indication that a logical zero is to be provided to an output buffer of a memory device via a data voltage signal representative of data to be read from a plurality of memory banks coupled to the output buffer;
  receive a second indication of a time in which a first pull-down switch configured to couple the output buffer to ground is to be closed based on the first indication; and
  generate a pulse signal using a pulse generator after the pulse generator has received an enable signal configured to cause the pulse generator to operate, wherein the pulse signal is configured to cause a second pull-down switch to close synchronously with the first pull-down switch based on the second indication, wherein the second pull-down switch is configured to couple the output buffer to the ground.

8. The driver circuit of claim 7, wherein the pulse signal comprises a width determined based on an impedance value associated with the output buffer, an upper voltage limit associated with the output buffer, a lower voltage limit associated with the output buffer, a slew rate associated with the output buffer, or any combination thereof.

9. The driver circuit of claim 7, wherein the enable signal is provided to the pulse generator based on a test mode circuit.

10. The driver circuit of claim 9, wherein the test mode circuit is configured to blow a fuse that causes the enable signal to be provided the pulse generator.

11. The driver circuit of claim 7, wherein the enable signal is provided to the pulse generator in response to the data voltage signal failing to reach a low voltage value within a half cycle.

12. The driver circuit of claim 7, comprising a resistor coupled between the second pull-down switch and the output buffer.

13. The driver circuit of claim 12, comprising a second resistor coupled between the output buffer and voltage source, wherein an impedance value of the resistor is determined based on the second resistor.

14. A method, comprising:
  transmitting, via a circuit, an initial clock frequency to a clock component configured to output a clock signal for a memory device;
  transmitting, via the circuit, test data to a driver circuit configured to output a data voltage signal representative of the test data on an output buffer;
  determining, via the circuit, whether the data voltage signal is acceptable based on a transition between voltage values while the memory device operates at the initial clock frequency; and
  transmitting, via the circuit, an enable signal configured to cause a pulse generator to operate in response to the data voltage signal not being acceptable, wherein the pulse generator is configured to generate a pulse signal configured to cause a first pull-down switch to close synchronously with a second pull-down switch based on an indication that the data voltage signal is transitioning between the voltage value.

15. The method of claim 14, wherein the pulse signal comprises a width determined based on an impedance value associated with the output buffer, an upper voltage limit associated with the output buffer, a lower voltage limit associated with the output buffer, a slew rate associated with the output buffer, or any combination thereof.

16. The method of claim 14, comprising:
  determining, via the circuit, whether the initial clock frequency corresponds to a specified clock frequency; and
  transmitting, via the circuit, a command to cause the internal clock to increase the initial clock frequency in response to the initial clock frequency not corresponding to the specified clock frequency.

17. The method of claim 16, comprising transmitting, via the circuit, a second command to cause the internal clock to increase a second clock frequency in response to the second clock frequency not corresponding to the specified clock frequency.

18. The method of claim 14, comprising:
  transmitting, via the circuit, a first gate signal to the first pull-down switch, wherein the first gate signal is configured to cause the first pull-down switch to close at a first time;
  transmitting, via the circuit, a second gate signal to the second pull-down switch based on the pulse signal, wherein the second gate signal is configured to cause the second pull-down switch to close at the first time.

19. The method of claim 14, wherein determining, via the circuit, whether the data voltage signal is acceptable is based on a slew rate associated with the transition between voltage values of the data voltage signal.

20. A semiconductor device, comprising:
  a plurality of memory banks;
  an output buffer configured to couple to the plurality of memory banks, wherein the output buffer is configured to produce a data voltage signal representative of data to be read from at least one of the plurality of memory banks;
  a driver circuit comprising a pulse generator and a pull-down switch configured to couple the output buffer to ground, wherein the pull-down switch is configured to provide the data voltage signal to the output buffer; and a test mode circuit configured to:
- determine whether the data voltage signal is acceptable or not acceptable wherein the test mode circuit is configured to determine whether the data voltage signal is acceptable based on whether the data voltage signal reaches a low voltage value within an amount of time; and
- send an enable signal to the pulse generator if the data voltage signal is not acceptable, wherein the enable signal is configured to cause the pulse generator to operate.

* * * * *